US012632406B2

(12) United States Patent     (10) Patent No.:   US 12,632,406 B2

Wu et al.     (45) Date of Patent:    May 19, 2026

(54) METHOD AND SYSTEM FOR GENERATING CLOCK SIGNAL OF I²S AUDIO BUS, AND DAC CIRCUIT

(71) Applicant: SUZHOU SONAVOX ELECTRONICS CO., LTD., Suzhou (CN)

(72) Inventors: Yurong Wu, Suzhou (CN); Hongbing Ding, Suzhou (CN)

(73) Assignee: Suzhou Sonavox Electronics Co., Ltd., Suzhou (CN)

( * ) Notice: Subject to any disclaimer, the term of this patent is extended or adjusted under 35 U.S.C. 154(b) by 183 days.

(21) Appl. No.: 18/716,885

(22) PCT Filed: Nov. 18, 2022

(86) PCT No.: PCT/CN2022/132896

§ 371 (c)(1),
(2) Date: Jun. 5, 2024

(87) PCT Pub. No.: WO2023/103749

PCT Pub. Date: Jun. 15, 2023

(65) Prior Publication Data

US 2025/0045239 A1    Feb. 6, 2025

(30) Foreign Application Priority Data

Dec. 7, 2021   (CN) .......................... 202111484675.4

(51) Int. Cl.
   *G06F 13/42*      (2006.01)
   *B60Q 5/00*      (2006.01)
   (Continued)

(52) U.S. Cl.
   CPC ............ *G06F 13/4282* (2013.01); *G06F 1/08* (2013.01); *G06F 13/4291* (2013.01); *H03M 1/66* (2013.01);
       (Continued)

(58) Field of Classification Search
   CPC .... G06F 13/4282; G06F 1/08; G06F 13/4291; G06F 2213/0002; H03M 1/66; B60Q 5/006; H04L 12/40; H04L 2012/40273
     (Continued)

(56) References Cited

U.S. PATENT DOCUMENTS 8,605,846 B2 * 12/2013 Felder ....................... H03L 7/16
                                375/372
2019/0005974 A1   1/2019   Hariharan et al.
2021/0357352 A1 * 11/2021   Anand ................ G06F 9/44505

FOREIGN PATENT DOCUMENTS

CN      200944639 Y    9/2007
CN      102545896 A    7/2012
       (Continued)

OTHER PUBLICATIONS

International Search Report dated Feb. 10, 2023 in Application No. PCT/CN2022/132896 in 16 pages.

(Continued)

*Primary Examiner* — Khai M Nguyen

(74) *Attorney, Agent, or Firm* — Knobbe, Martens, Olson & Bear, LLP

(57) ABSTRACT

Disclosed are a method and system for generating clock signal of I²S audio bus, and a dac circuit. The method includes: reading an audio file transmitted by the I²S audio bus, by a master controller; the master controller reading sampling rate, data bit length, and number of channels of the audio file, and, calculating data volume for each frame according to the data bit length and the number of channels, generating a master clock signal according to a multiplier requirement of a slave controller on the master clock signal, a frequency of the master clock signal being $f_s \times X$, wherein $f_s$ is the sampling rate, and X is a selected multiplier; and the slave controller receiving the master clock signal, and using (Continued)

the master clock signal as a clock source, to realize modulation and filtering for an audio digital-to-analog conversion.

13 Claims, 4 Drawing Sheets

(51) Int. Cl.
    *G06F 1/08*           (2006.01)
    *H03M 1/66*         (2006.01)
    *H04L 12/40*       (2006.01)

(52) U.S. Cl.
    CPC ...... *B60Q 5/006* (2013.01); *G06F 2213/0002* (2013.01); *H04L 12/40* (2013.01); *H04L 2012/40273* (2013.01)

(58) Field of Classification Search
    USPC ........................................................ 341/144
    See application file for complete search history.

(56)           References Cited

FOREIGN PATENT DOCUMENTS

| | | | |
|---|---|---|---|
| CN | 102946247 | A | 2/2013 |
| CN | 207354556 | U | 5/2018 |
| CN | 108319441 | A | 7/2018 |
| CN | 108391202 | A | 8/2018 |
| CN | 110166891 | A | 8/2019 |
| CN | 113518300 | A | 10/2021 |
| CN | 114253896 | A | 3/2022 |
| WO | WO 2023/103749 | A1 | 6/2023 |

OTHER PUBLICATIONS

Office Action issued in Chinese Patent Application No. 202111484675.4 dated Nov. 20, 2023 in 14 pages.

* cited by examiner

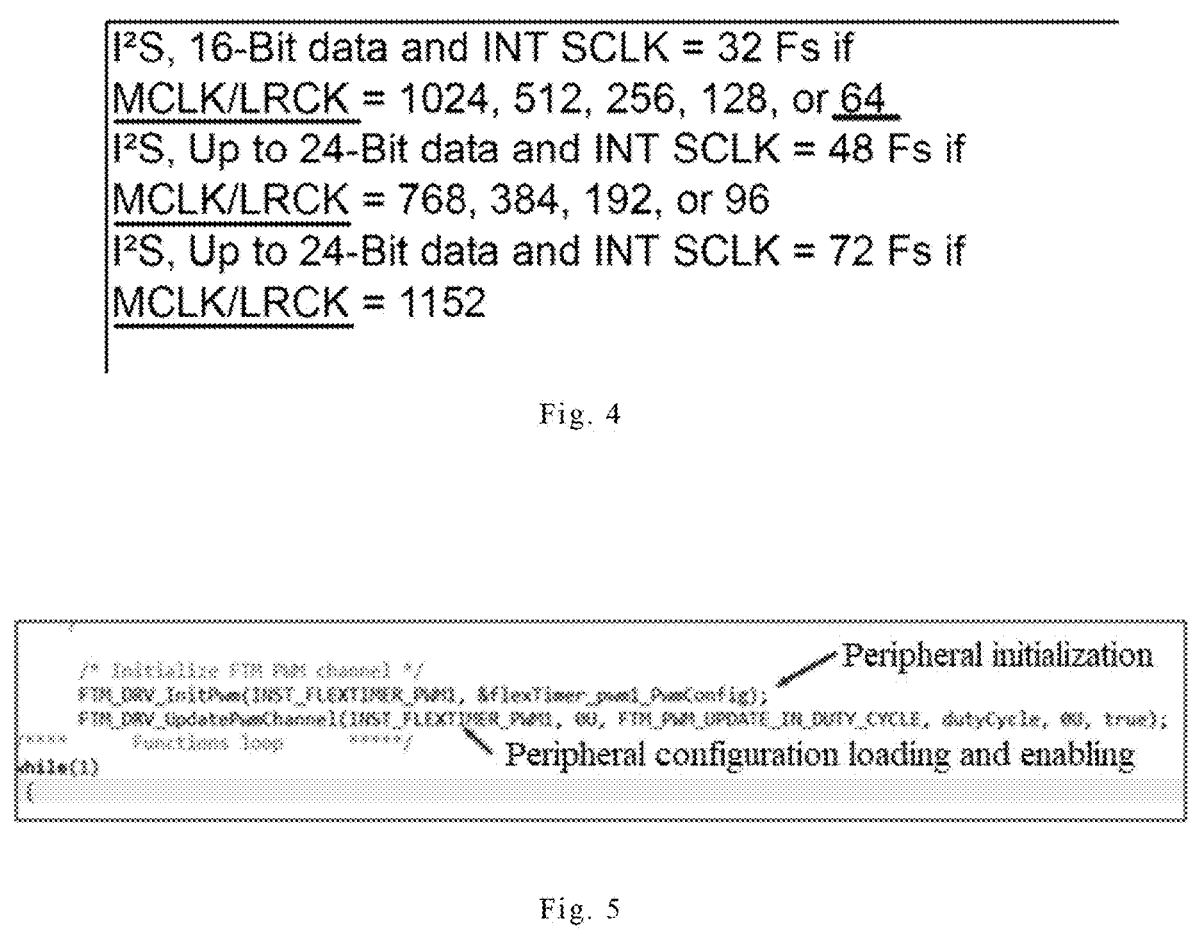

I²S, 16-Bit data and INT SCLK = 32 Fs if
MCLK/LRCK = 1024, 512, 256, 128, or 64
I²S, Up to 24-Bit data and INT SCLK = 48 Fs if
MCLK/LRCK = 768, 384, 192, or 96
I²S, Up to 24-Bit data and INT SCLK = 72 Fs if
MCLK/LRCK = 1152

Fig. 4

```
/* Initialize FTM PWM channel */
FTM_DRV_InitPwm(INST_FLEXTIMER_PWM1, &flexTimer_pwm1_PwmConfig);
FTM_DRV_UpdatePwmChannel(INST_FLEXTIMER_PWM1, 0U, FTM_PWM_UPDATE_IN_DUTY_CYCLE, dutyCycle, 0U, true);

/*         functions loop        */
while(1)
{
```

Peripheral initialization

Peripheral configuration loading and enabling

Fig. 5

METHOD AND SYSTEM FOR GENERATING CLOCK SIGNAL OF I²S AUDIO BUS, AND DAC CIRCUIT

The present application is the U.S. National Phase under 35. U.S.C. § 371 of International Application PCT/CN2022/132896, filed Nov. 11, 2022, which claims priority from Chinese Patent Application No. CN 2021114846754 filed on Dec. 7, 2021.

FIELD OF TECHNOLOGY

The present disclosure belongs to the field of audio systems, and relates to a method and system for generating a clock signal of an I²S audio bus, and a DAC (digital-to-analog conversion) circuit, in particular to a method and system for generating a clock signal of an I²S audio bus that does not need a crystal oscillator.

BACKGROUND

More and more audio bus is used in vehicle entertainment systems or warning acoustic systems, due to its strong anti-interference ability, wherein dates are sent in I²S bus format at the sending end, and restored through a DAC chip or a DAC module on the chip at the receiving end. Most DAC conversion chips require a master clock signal that multiplies the sampling frequency, and supply it to a modulator and digital filter in the form of 'Δ~Σ', to generate an analog signal of audio.

For the currently mainstream dual-channel audio formats, generally, a controller with a audio bus peripheral often only provides data ports (DIN, DOUT), DBCLK and LRCK signal ports on the on-chip peripheral, rather than high-frequency MCLK. On the other hand, the recommended reference solutions and mainstream product designs provided by chip level solution providers for DAC or integrated I²S bus receivers use an active crystal oscillator at 12.288 MHZ (or other frequency multiplications such as 24.576 MHz), to match audio information at different sampling rates.

There are also some chips for digital audio solutions, such as CODEC chip and audio DSP chip, which have dedicated MCLK pins to provide corresponding clock information, however, these chip solutions require an external crystal oscillator of 12.288 MHZ (or other frequency multiplications such as 24.576 MHz) to be connected to the master chip, which may be an active crystal oscillator, a passive crystal oscillator, or other oscillator components.

Based on the above current situations, most designs and applications using the I²S solution use such a special-frequency oscillator circuit to provide MCLK signals to the slave chip. On the one hand, it involves hardware costs, and on the other hand, the higher the frequency of the signal, the higher the requirements for circuit design, especially PCB design, which increases the complexity of hardware circuit design.

SUMMARY

Base on the above problems, the present disclosure provides a method and system for generating a clock signal of an I²S audio bus, and a DAC circuit, which does not need external special-frequency crystal oscillator, and simplifies the design of the hardware circuit, and reduces the electronics cost.

An aspect of the present disclosure provides a method for generating a clock signal of an I²S audio bus, including steps of:

reading an audio file transmitted by the I²S audio bus, by a master controller:

the master controller reading sampling rate, data bit length, and number of channels of the audio file, and, calculating data volume for each frame according to the data bit length and the number of channels, generating a master clock signal according to a multiplier requirement of a slave controller on the master clock signal, a frequency of the master clock signal being $f_s \times X$, wherein $f_s$ is the sampling rate, and X is a selected multiplier:

the slave controller receiving the master clock signal, and using the master clock signal as a clock source, to realize modulation and filtering for an audio digital-to-analog conversion.

In an embodiment, X is an integer multiple more than twice of the data volume for each frame.

In an embodiment, the data volume for each frame is calculated according to the following formula (1):

$$Data = L \times 2 \qquad (1)$$

wherein, L is the data bit length.

In an embodiment, a signal after the digital-to-analog conversion is a dual-channel analog signal.

In an embodiment, the master controller is a master chip with an MCLK output port, and the slave controller is a slave chip with an MCLK input port, and the MCLK output port is electrically connected to the MCLK input port to output the master clock signal generated by the master chip to the slave chip.

Another aspect of the present disclosure provides a system for generating a clock signal of an I²S audio bus, including a master chip with an MCLK output port and a slave chip with an MCLK input port, the MCLK output port is electrically connected to the MCLK input port, the master chip is configured to read an audio file transmitted by the I²S audio bus, read sampling rate, data bit length, and number of channels of the audio file, and, calculate data volume for each frame according to the data bit length and the number of channels, generate a master clock signal according to a multiplier requirement of the slave chip on the master clock signal and output it from the MCLK output port, a frequency of the master clock signal is $f_s \times X$, wherein $f_s$ is the sampling rate, and X is a selected multiplier:

the slave chip is configured to receive the master clock signal through the MCLK input port, and use the master clock signal as a clock source, to realize modulation and filtering for an audio digital-to-analog conversion.

In an embodiment, X is an integer multiple more than twice of the data volume for each frame, and the data volume for each frame is calculated according to the following formula (1):

$$Data = L \times 2 \qquad (1)$$

wherein, L is the data bit length.

In an embodiment, a signal after the digital-to-analog conversion is a dual-channel analog signal.

In an embodiment, the master chip further has a DBCLK port for outputting serial data bits to the slave chip, an LRCLK port for outputting left and right channel clock signals to the slave chip, and a DOUT port for outputting data to the slave chip, the slave chip further has a DBCLK port for inputting serial data bits, an LRCLK port for inputting left and right channel clock signals, and a DIN port for inputting data, the DBCLK port of the master chip is directly connected or connected through a resistor to the DBCLK port of the slave chip, the LRCLK port of the master chip is directly connected or connected through a resistor to the LRCLK port of the slave chip, and the DOUT port of the master chip is directly connected or connected through a resistor to the DIN port of the slave chip.

In an embodiment, the MCLK output port is directly connected to the MCLK input port or a resistor is connected in series between the MCLK output port and the MCLK input port.

In an embodiment, the slave chip further has a DOUT port for outputting data to the master chip, the master chip further has a DIN port for inputting data, and the DOUT port of the slave chip is directly connected or connected through a resistor to the DIN port of the master chip.

A third aspect of the present disclosure provides a DAC circuit of a vehicle audio system, including the system for generating a clock signal mentioned above.

In some embodiments, the DAC circuit has an input end for being electrically connected to an MCU chip through the I²S audio bus and an output end for being electrically connected to an input end of a power amplifier, the MCU chip is configured to receive an audio source file, and the power amplifier is configured to drive a vehicle loudspeaker to produce an audio.

In some embodiments, the audio source file is transmitted to the MCU chip through a vehicle port and a vehicle bus, the MCU chip is electrically connected to the DAC circuit through the I²S audio bus, the DAC circuit is electrically connected to the input end of the power amplifier, and an output end of the power amplifier is electrically connected to the on-board loudspeaker. Wherein, the DAC circuit implements the method for generating a clock signal mentioned above, which converts the audio file transmitted by the I²S audio bus into a dual channel analog signal and sends it to the power amplifier without the need for any external crystal oscillator.

A fourth aspect of the present disclosure provides a DAC circuit of a acoustic alerting device, including the system for generating a clock signal mentioned above.

In some embodiments, the DAC circuit has an input end for being electrically connected to an MCU chip through the I²S audio bus and an output end for being electrically connected to an input end of a power amplifier, the MCU chip is configured to receive an audio source file, and the power amplifier is configured to drive the acoustic alerting device to produce an audio.

The acoustic alerting device is a sounding device mounted on the outside of a vehicle, which can improve the sound quality of low-speed pedestrian warning audio for new energy vehicles such as electric and hybrid vehicles. It comprises a loudspeaker for generating warning audio (mounted on the vehicle and transmitting audio to the outside of the vehicle) and a power amplifier for driving the loudspeaker to generate audio. It further comprises a vehicle serial bus interface circuit (CAN, LIN, etc.), which are used to obtain vehicle speed signals of the new energy vehicles.

The present disclosure adopts the above solutions and has the following advantages over conventional art:

the method and system for generating a clock signal of the present disclosure obtain the sampling rate, data bit length, and number of channels of the audio file transmitted through the I²S audio bus by parsing the audio file, and output the master clock signal supporting the DAC conversion of the slave controller to the slave controller according to the multiplier requirements of the slave controller for the DAC master clock, which thus eliminates the need for external special-frequency crystal oscillators in the I²S DAC circuit, simplifies the design of the hardware circuit, and reduces the electronics costs.

BRIEF DESCRIPTION OF THE DRAWINGS

For more clearly explaining the technical solutions in the embodiments of the present disclosure, the accompanying drawings required to be used to in the description of the embodiments will be simply introduced below. Apparently, the drawings in the following description show merely some embodiments of the present disclosure, and those of ordinary skill in the art may derive other drawings from these accompanying drawings without creative efforts.

FIG. 4 shows a Master table of an I²S DAC conversion chip:

FIG. 5 shows the program call of FTM0 in the main program.

DETAILED DESCRIPTION OF EXEMPLARY EMBODIMENTS

The preferable embodiments of the present disclosure are explained below in detail combining with the accompanying drawings so that the advantages and features of the present disclosure can be easily understood by the skilled persons in the art. It should be noted that the explanation on these implementations is to help understanding of the present disclosure, and is not intended to limit the present disclosure. Further, the technical features involved in the various embodiments of the present disclosure described below may be combined with each other as long as they do not conflict with each other.

According to an embodiment of the present disclosure, by extracting the sampling rate, data bit length, and number of channels of the audio file from the parsing results of the audio file, through the on-chip peripheral module of the master controller including but not limited to: a clock module, a PWM module, a comparator output module, a PLL module, etc, or by using pure software codes without calling any of the aforementioned peripherals to write, a square signal that can generate a corresponding flipped output on the chip port that conforms to MCLK characteristics is implemented (whether implemented through peripheral modules or pure codes, hereinafter collectively referred to as the 'frequency multiplication module'), an LRCK frequency multiplier is generated, the multiplication frequency is according to the requirements of MCLK in the chip manual, and a multiplication clock signal is generated.

Figure 1:
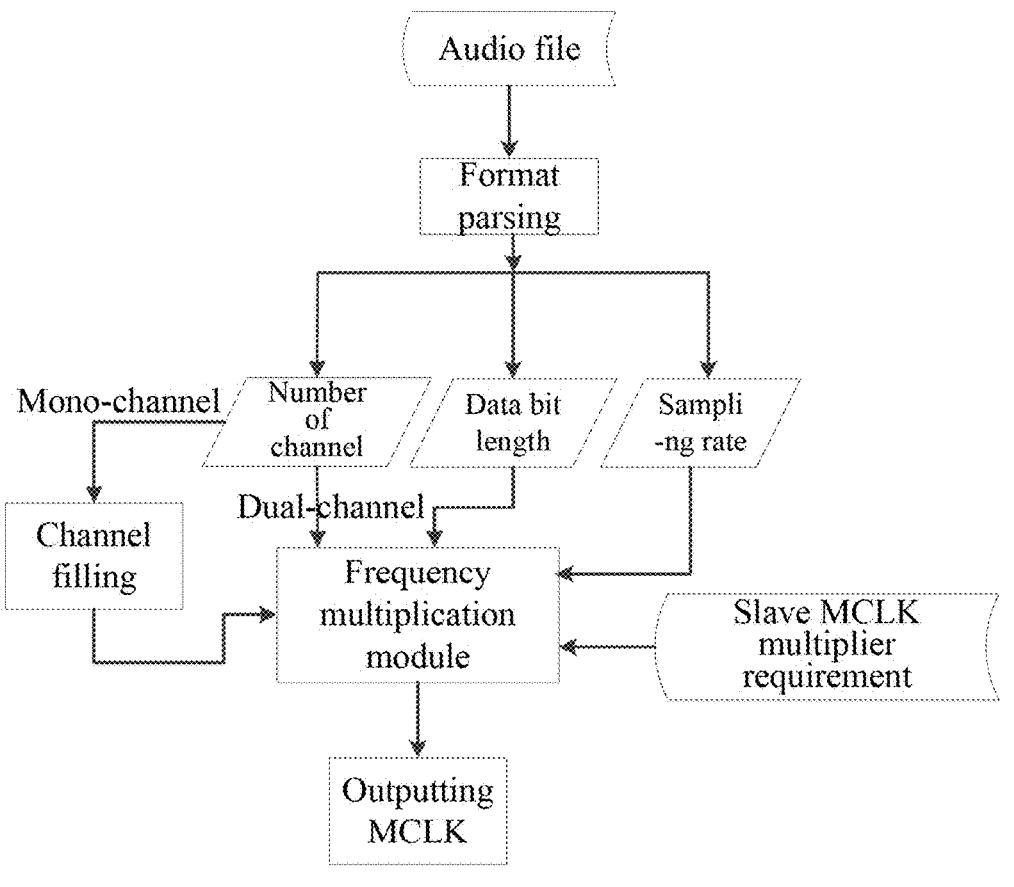
FIG. 1 is a flow chart of a method for generating a clock signal according to an embodiment of the present disclosure.

Referring to FIG. 1, a method for generating a clock signal of an I²S audio bus of the embodiment includes steps of:

reading an audio file transmitted by the I²S audio bus, by a master controller:

the master controller reading the sampling rate, the data bit length, and the number of channels of the audio file, and, calculating a data volume for each frame according to the data bit length and the number of channels, generating a master clock signal according to a multiplier requirement of a slave controller on the master clock signal, the frequency of the master clock signal being $f_s \times X$, wherein $f_s$ is the sampling rate, and X is a selected multiplier;

the slave controller receiving the master clock signal, and using the master clock signal as a clock source, to realize modulation and filtering for an audio digital-to-analog conversion, and outputting an analog signal for feeding to a power amplifier.

Specifically, the master controller is a master chip, and the slave controller is a slave chip. The program of the master chip reads the following information about the audio file transmitted by the I²S audio bus:

the set multiplier is X, the data word length is L, the number of channels is 2, the frame frequency is $f_w$, the sampling rate is $f_s$, the data volume for each frame is calculated to be: Data=L×2 the selected multiplier X comes from the Master table in the chip manual or application manual, usually an integer multiple more than 2 times of Data. According to the multiplication requirements of the master clock signal MCLK in practical applications, a suitable master clock signal MCLK for the slave chip is generated. The frequency of the master clock signal MCLK is: $f_s \times X$.

For example, parsing an audio file to obtain a data length of 16 bits, a sampling rate of 16 KHz, and a number of channels of 2, and an audio file with a data word length of 16 bits parsed by the master chip requires MCLK to be 1024, 512, 256, 128, or 64 times of LRCK, through calculation, the data volume for each frame is 32 bits, so a multiplier of 64 times is directly used. Therefore, the frequency of MCLK is: 16 KHz×64=1 MHz. Therefore, through the on-chip peripheral of the master controller and the frequency multiplication module, a 1 MHz signal with a duty cycle that matches the MCLK duty cycle of the slave chip, such as 50%, is generated, to be transmitted to the MCLK port of the slave chip. Of course, a multiplier of 128 may also be used to generate a 2 MHz clock.

The number of channels is 2, correspondingly, the signal after the digital-to-analog conversion of the slave chip is a dual-channel analog signal.

Figure 2A:
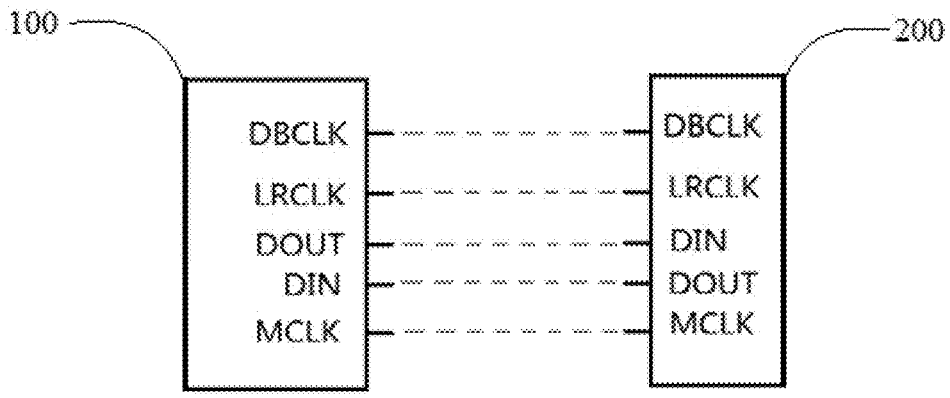
FIG. 2a is a structure block diagram of a system for generating a clock signal according to an embodiment of the present disclosure.

FIG. 2a shows a system for generating a clock signal according to the embodiment. Referring to FIG. 2a, the system for generating a clock signal comprises a master chip 100 and a slave chip 200. The master chip 100 has a DBLCK port, an LRCLK port, a DOUT port, a DIN port, and an MCLK port, and the slave chip 200 has a DBLCK port, an LRCLK port, a DIN port, a DOUT port, and an MCLK port.

The master chip 100 is configured to read an audio file transmitted by the I²S audio bus, read the sampling rate, the data bit length, and the number of channels of the audio file, and, calculate a data volume for each frame according to the data bit length and the number of channels, generate a master clock signal according to a multiplier requirement of the slave chip 200 on the master clock signal and output it from the MCLK output port, the frequency of the master clock signal is $f_s \times X$, wherein $f_s$ is the sampling rate, and X is the selected multiplier.

The slave chip 200 is configured to receive the master clock signal through the MCLK input port, and use the master clock signal as a clock source, to realize modulation and filtering for an audio digital-to-analog conversion, and output an analog signal for sending to a power amplifier.

Wherein, the DBCLK port of the master chip 100 is directly electrically connected to the DBCLK port of the slave chip 200, thereby transmitting a serial data bit clock signal (DBCLK) from the master chip 100 to the slave chip 200. The LRCLK port of the master chip 100 is directly electrically connected to the LRCLK port of the slave chip 200, thereby transmitting the left and right channel clock signals (LRCLK) from the master chip 100 to the slave chip 200. The DOUT port of the master chip 100 is directly electrically connected to the DIN port of the slave chip 200, thereby transmitting audio data from the master chip 100 to the slave chip 200. The MCLK port of the master chip 100 is directly electrically connected to the MCLK port of the slave chip 200, thereby transmitting the generated master clock signal (MCLK) from the master chip 100 to the slave chip 200. Further, the DOUT port of the slave chip 200 is directly electrically connected to the DIN port of the master chip 100, thereby enabling the transmission of the audio data from the slave chip 200 to the master chip 100: in other words, bidirectional data transmission can be realized between the master chip 100 and the slave chip 200. The master chip 100 can run a bus audio parsing program to parse an audio file received from the I²S audio bus, and can also generate a master clock signal according to the above method. The slave chip 200 uses the master clock signal as the clock source, and uses a modulator and a digital filter in the form of 'Δ~Σ' to implement the modulation and filtering of an audio digital-to-analog conversion, to modulate and convert the audio data received from the master chip 100 based on the master clock signal, the serial data bit clock signal, and the left and right channel clock signals received from the master chip 100 and generate an audio analog signal sent to the power amplifier, which drives the loudspeaker to produce audio. In this system, the master clock signal is not provided by any passive or active oscillator devices (such as crystal oscillators, ceramic oscillators, separation logic devices, etc.), but is implemented through the master chip 100 and its internal programs.

Figure 2B:
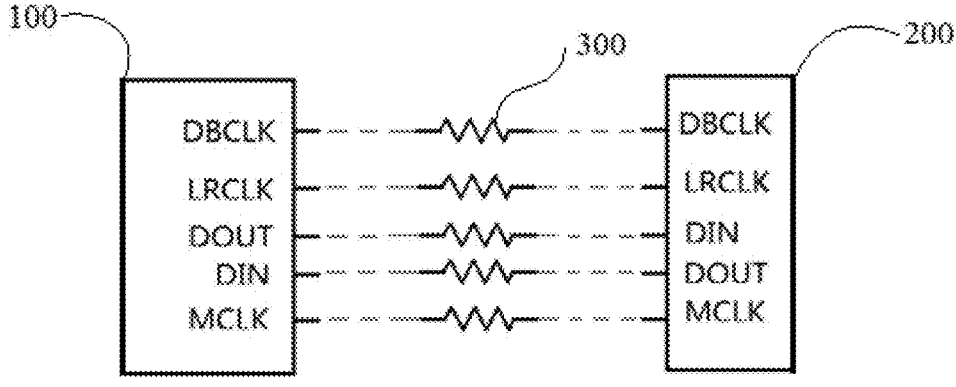
FIG. 2b is a structure block diagram of another system for generating a clock signal according to an embodiment of the present disclosure.

FIG. 2b shows another system for generating a clock signal according to the embodiment. As shown in FIG. 2b, the system for generating a clock signal is basically the same as the system for generating a clock signal shown in FIG. 2a, only differs in that: resistors 300 are connected in series between the ports of the master chip 100 and the ports of the slave chip 200, and the two are electrically connected through a resistor 300 to achieve better signal transmission performance. Specifically, a resistor 300 is connected in series between the DBCLK port of the master chip 100 and the DBCLK port of the slave chip 200, a resistor 300 is connected in series between the LRCLK port of the master chip 100 and the LRCLK port of the slave chip 200, a resistor 300 is connected in series between the DIN port of the master chip 100 and the DOUT port of the slave chip 200, a resistor 300 is connected in series between the DOUT port of the master chip 100 and the DIN port of the slave chip 200, and a resistor 300 is connected in series between the MCLK port of the master chip 100 and the MCLK port of the slave chip 200.

Figure 2C:
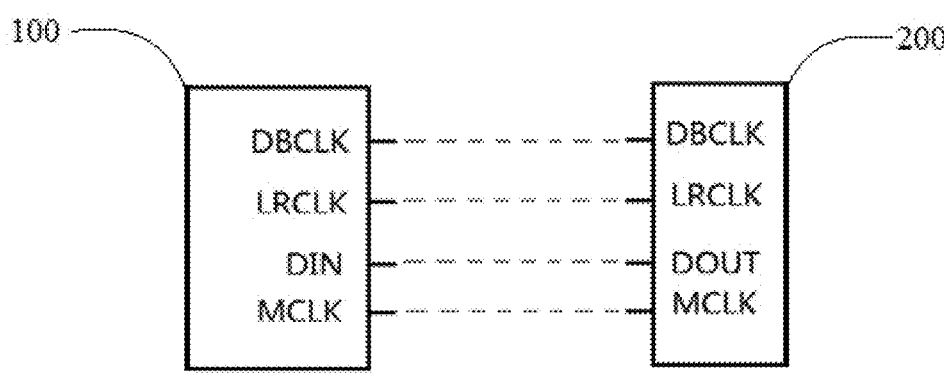
FIG. 2c is a structure block diagram of yet another system for generating a clock signal according to an embodiment of the present disclosure.

FIG. 2c shows yet another system for generating a clock signal according to the embodiment. As shown in FIG. 2c, the system for generating a clock signal is basically the same as the system for generating a clock signal shown in FIG. 2a, only differs in that: the master chip 100 does not have a DIN port, and the slave chip 200 does not have a DOUT port, that is to say, bidirectional data transmission cannot be achieved between the master chip 100 and the slave chip 200, and audio data can only be transmitted from the master chip 100 to the slave chip 200.

Figure 2D:
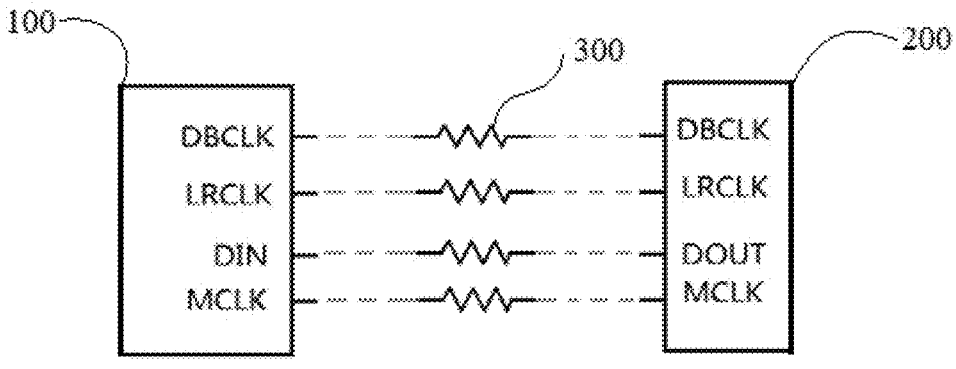
FIG. 2d is a structure block diagram of a fourth system for generating a clock signal according to an embodiment of the present disclosure.

FIG. 2d shows still another system for generating a clock signal according to the embodiment. As shown in FIG. 2d, the system for generating a clock signal is basically the same as the system for generating a clock signal shown in FIG. 2a, only differs in that: the master chip 100 does not have a DIN port, the slave chip 200 does not have a DOUT port, and audio data can only be transmitted from the master chip 100 to the slave chip 200; resistors 300 are connected in series between the ports of the master chip 100 and the ports of the slave chip 200, and the two are electrically connected through a resistor 300 to achieve better signal transmission performance. Specifically, a resistor 300 is connected in series between the DBCLK port of the master chip 100 and the DBCLK port of the slave chip 200, a resistor 300 is connected in series between the LRCLK port of the master chip 100 and the LRCLK port of the slave chip 200, a resistor 300 is connected in series between the DOUT port of the master chip 100 and the DIN port of the slave chip 200, and a resistor 300 is connected in series between the MCLK port of the master chip 100 and the MCLK port of the slave chip 200.

Figure 3:
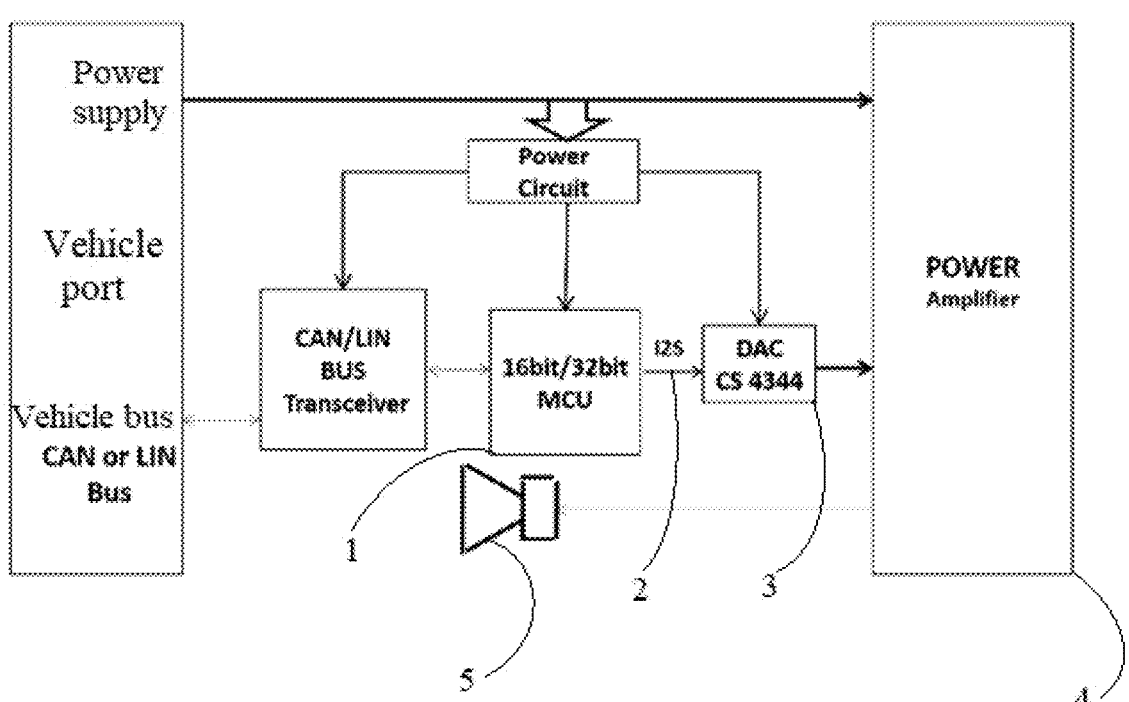
FIG. 3 is a schematic diagram of a vehicle audio system applying this embodiment.

FIG. 3 shows a specific application of the method and system according to the embodiment in a vehicle audio system. The embodiment further provides a DAC circuit of a vehicle audio system, which comprises the master chip 100 and the slave chip 200 mentioned above, the DAC circuit 3 is connected between an MCU chip 1 and a power amplifier 4 to convert an audio file into a stereo-channel analog signal, which is amplified by the power amplifier and sent to the vehicle loudspeaker for audio reproduction. Referring to FIG. 3, the DAC circuit 3 comprises the system for generating a clock signal of the embodiment, the audio source file is transmitted to the MCU chip 1 through a vehicle port and a vehicle bus, the MCU chip 1 is electrically connected to the DAC circuit 3 through the I²S audio bus, the DAC circuit 3 is electrically connected to the input end of the power amplifier 4, and an output end of the power amplifier 4 is electrically connected to the vehicle loudspeaker 5. Wherein, the DAC circuit 3 implements the method for generating a clock signal of the embodiment, which converts the audio file transmitted by the I²S audio bus into a dual channel analog signal and sends it to the power amplifier 4 without the need for any external crystal oscillator.

The embodiment further provides a DAC circuit of a acoustic alerting device, which comprises the master chip 100 and the slave chip 200 mentioned above, the DAC circuit 3 is connected between an MCU chip 1 and a power amplifier 4 to convert an audio file into a stereo-channel analog signal, which is amplified by the power amplifier and sent to the acoustic alerting device to emit a warning audio.

Examples

1. By parsing the starting segment of the audio source file, it was found that the audio source information was: 16-bit, 2 channels, and a sampling rate of 16 KHz.
2. Refer to the Master table in the I²S DAC conversion chip manual (as shown in FIG. 4), the appropriate MCLK/LRCLK multiplier was selected, and here, 64 was selected.
3. The features shown in Table 1 were calculated using the above method.

TABLE 1

| Multiplier | X | 64 |
|---|---|---|
| Data word length | L | 16-bit |
| Number of channels | 2 | 2 |
| Frame frequency | $f_w$ | 16 KHz (L = 1/R = 0) |
| Sampling rate | $f_s$ | 16 KHz |
| Frame data volume | L × 2 | 2*16 bits = 4 bytes |
| MCLK frequency | $f_s$ × X | 16 KHz*64 = 1 MHz |

Therefore, it can be concluded that the MCLK clock required for the example is 1 MHZ.

4. The MCU (Microcontroller, hereinafter referred to as Single Chip Microcomputer) used in the example was FS32K144, and the external crystal oscillator was 8 MHz. The peripheral on the clock chip were selected from the built-in FTM module of the single chip microcomputer, specifically adopted FTM0.
   1) First, the port was configured, and MCLK was configured to FTM0 and port B13;
   2) The clock source of FTM0 was configured and one channel equal to the crystal oscillator clock was selected as the clock source:
   3) FTM0 module was configured, with an efficiency configured to 1 MHz and a duty cycle configured to 50%:
   4) As the IDE of the FS series single chip microcomputer, after completing the configuration, a single-use ProcessorExpert code was generated:
   5) The call of FTM0 program in the main program is shown in FIG. 5.

As shown in the description and claims of the present disclosure, the terms "comprising" and "containing" only indicate that the clearly identified steps and elements are included, and these steps and elements do not constitute an exclusive list, and the method or device may also include other steps or elements.

It should be further understood that in the present disclosure, "a plurality of" refers to two or more, and other quantifiers are similar.

It can be further understood that the terms "first", "second", etc. are used to describe various information, but this information should not be limited to these terms. These terms are only used to distinguish the same type of information from each other and do not indicate a specific order or degree of importance. In fact, expressions such as "first" and "second" can be used interchangeably. For example, without departing from the scope of the present disclosure, the first information can also be referred to as the second information, and similarly, the second information can also be referred to as the first information.

In this embodiment, unless otherwise expressly specified and limited, a first feature being "on" or "under" a second feature may include direct contact between the first feature and the second feature, as well as contact between the first feature and the second feature through an intermediate medium between them rather than direct contact. Also, the first feature being "on", "above", or "over" the second feature includes that the first feature is directly above or obliquely above the second feature, or simply means that the first feature is level higher than the second feature. The first feature being "under", "below" or "underneath" the second feature includes that the first feature is directly below or obliquely below the second feature, or simply means that the first feature has a lower level than the second feature.

The embodiments described above are only for illustrating the technical concepts and features of the present disclosure, are preferred embodiments, and are intended to make those skilled in the art being able to understand the present disclosure and thereby implement it, and should not be concluded to limit the protective scope of this disclosure.

We claim:

1. A method for generating a clock signal of an I²S audio bus, comprising:

reading an audio file transmitted by the I²S audio bus, by a master controller;

the master controller reading sampling rate, data bit length, and number of channels of the audio file, and, calculating data volume for each frame according to the data bit length and the number of channels, generating a master clock signal according to a multiplier requirement of a slave controller on the master clock signal, a frequency of the master clock signal being $f_s \times X$, wherein $f_s$ is the sampling rate, and X is a selected multiplier; and the slave controller receiving the master clock signal, and using the master clock signal as a clock source, to realize modulation and filtering for an audio digital-to-analog conversion.

2. The method for generating a clock signal as claimed in claim 1, wherein, X is an integer multiple more than twice of the data volume for each frame.

3. The method for generating a clock signal as claimed in claim 1, wherein, the data volume for each frame is calculated according to the following formula:

$$Data = L \times 2$$

wherein, L is the data bit length.

4. The method for generating a clock signal as claimed in claim 1, wherein, a signal after the audio digital-to-analog conversion is a dual-channel analog signal.

5. The method for generating a clock signal as claimed in claim 1, wherein, the master controller is a master chip with an MCLK output port, and the slave controller is a slave chip with an MCLK input port, and the MCLK output port is electrically connected to the MCLK input port to output the master clock signal generated by the master chip to the slave chip.

6. A system for generating a clock signal of an I²S audio bus, comprising a master chip with an MCLK output port and a slave chip with an MCLK input port, the MCLK output port being electrically connected to the MCLK input port, wherein, the master chip is configured to read an audio file transmitted by the I²S audio bus, read a sampling rate, a data bit length, and a number of channels of the audio file, and, calculate data volume for each frame according to the data bit length and the number of channels, generate a master clock signal according to a multiplier requirement of the slave chip on the master clock signal and output it from the MCLK output port, a frequency of the master clock signal is $f_s \times X$, wherein $f_s$ is the sampling rate, and X is a selected multiplier; and the slave chip is configured to receive the master clock signal through the MCLK input port, and use the master clock signal as a clock source, to realize modulation and filtering for an audio digital-to-analog conversion.

7. The system for generating a clock signal as claimed in claim 6, wherein, X is an integer multiple more than twice of the data volume for each frame, and the data volume for each frame is calculated according to the following formula:

$$Data = L \times 2$$

wherein, L is the data bit length.

8. The system for generating a clock signal as claimed in claim 6, wherein, a signal after the audio digital-to-analog conversion is a dual-channel analog signal.

9. The system for generating a clock signal as claimed in claim 6, wherein, the master chip further has a DBCLK port for outputting serial data bits to the slave chip, an LRCLK port for outputting left and right channel clock signals to the slave chip, and a DOUT port for outputting data to the slave chip, the slave chip further has a DBCLK port for inputting the serial data bits, an LRCLK port for inputting the left and right channel clock signals, and a DIN port for inputting data, the DBCLK port of the master chip is directly connected or connected through a resistor to the DBCLK port of the slave chip, the LRCLK port of the master chip is directly connected or connected through a resistor to the LRCLK port of the slave chip, and the DOUT port of the master chip is directly connected or connected through a resistor to the DIN port of the slave chip.

10. The system for generating a clock signal as claimed in claim 6, wherein, the MCLK output port is directly connected to the MCLK input port or a resistor is connected in series between the MCLK output port and the MCLK input port.

11. The system for generating a clock signal as claimed in claim 6, wherein, the slave chip further has a DOUT port for outputting data to the master chip, the master chip further has a DIN port for inputting data, and the DOUT port of the slave chip is directly connected or connected through a resistor to the DIN port of the master chip.

12. A DAC circuit of a vehicle acoustic alerting device, comprising the system for generating a clock signal as claimed in claim 6.

13. The DAC circuit as claimed in claim 12, wherein, the DAC circuit has an input end for being electrically connected to an MCU chip through the I²S audio bus and an output end for being electrically connected to an input end of a power amplifier, the MCU chip is configured to receive an audio source file, and the power amplifier is configured to drive a pedestrian alert loudspeaker to produce an audio.

* * * * *